US009876388B2

(12) United States Patent
Steiner-Jovic et al.

(10) Patent No.: US 9,876,388 B2
(45) Date of Patent: Jan. 23, 2018

(54) SYSTEM, METHOD AND DEVICE FOR PROVIDING A STABLE POWER SOURCE WITHOUT THE USE OF DIRECT CONNECTION TO AN AC OR DC SOURCE

(71) Applicant: Awesense Wireless Inc., Vancouver (CA)

(72) Inventors: Mischa Steiner-Jovic, Vancouver (CA); Rick Slamka, Kelowna (CA)

(73) Assignee: AWESENSE WIRELESS INC., Vancouver, BC (CA)

( * ) Notice: Subject to any disclaimer, the term of this patent is extended or adjusted under 35 U.S.C. 154(b) by 453 days.

(21) Appl. No.: 14/404,436

(22) PCT Filed: May 28, 2013

(86) PCT No.: PCT/CA2013/000514
§ 371 (c)(1),
(2) Date: Nov. 26, 2014

(87) PCT Pub. No.: WO2013/177669
PCT Pub. Date: Dec. 5, 2013

(65) Prior Publication Data
US 2015/0137596 A1    May 21, 2015

Related U.S. Application Data

(60) Provisional application No. 61/652,700, filed on May 29, 2012.

(51) Int. Cl.
G01R 21/00       (2006.01)
H01F 27/24       (2006.01)
(Continued)

(52) U.S. Cl.
CPC ............. *H02J 7/04* (2013.01); *G01R 15/186* (2013.01); *G01R 21/00* (2013.01); *H01F 27/24* (2013.01);
(Continued)

(58) Field of Classification Search
USPC .......................................... 307/24
See application file for complete search history.

(56) References Cited

U.S. PATENT DOCUMENTS 8,594,956 B2 * 11/2013 Banting ............... G01R 15/142
324/127
2004/0183522 A1    9/2004 Gunn et al.
(Continued)

FOREIGN PATENT DOCUMENTS

EP    2040084 A1    3/2009
EP    2 241 898 A1    10/2010
(Continued)

OTHER PUBLICATIONS

International Search Report for International Patent Application No. PCT/CA2013/000514 filed May 28, 2013, 4 pages.

*Primary Examiner* — Rexford Barnie
*Assistant Examiner* — Xuan Ly
(74) *Attorney, Agent, or Firm* — Aeon Law PLLC; Adam L. K. Philipp; Jonathan E. Olson

(57) ABSTRACT

A combined energy harvesting and measuring device, for use in harvesting energy from a power line conductor and in optimizing load balance and charge as between one or more energy storage or energy drawing devices comprises a single, multi-function current transformer (CT) which itself comprises an electrical winding disposed thereon, the CT being configured to receive an induced current on the electrical winding via magnetic flux energy generated by alternating current on the power line conductor and, at the
(Continued)

same time, being configured to measure current flow on the power line conductor; and wherein there is a circuit electrically coupled to the electrical winding and configured to convert the harvested and received induced current into an electrical energy for consumption by an electrical device.

19 Claims, 3 Drawing Sheets

(51) Int. Cl.
    *H02J 13/00*    (2006.01)
    *H02J 15/00*    (2006.01)
    *H02J 7/04*    (2006.01)
    *G01R 15/18*    (2006.01)
    *H01F 38/14*    (2006.01)
    *H02J 7/00*    (2006.01)
    *H02J 7/02*    (2016.01)
    *H02J 7/34*    (2006.01)
    *H01F 38/30*    (2006.01)

(52) U.S. Cl.
    CPC ............ *H01F 38/14* (2013.01); *H02J 7/0022* (2013.01); *H02J 7/0068* (2013.01); *H02J 7/025* (2013.01); *H02J 13/00* (2013.01); *H02J 15/00* (2013.01); *H01F 2038/305* (2013.01); *H02J 7/345* (2013.01); *Y10T 307/352* (2015.04)

(56) References Cited

U.S. PATENT DOCUMENTS

| | | | |
|---|---|---|---|
| 2007/0290835 A1* | 12/2007 | Engel Hardt | ........ G01R 15/142 340/538.16 |
| 2009/0015196 A1 | 1/2009 | Baxter et al. | |
| 2009/0091302 A1* | 4/2009 | Rusan | ................... H01G 11/10 320/167 |
| 2010/0253318 A1 | 10/2010 | Thomas | |
| 2011/0241607 A1* | 10/2011 | Wiegers | ................. H02J 7/025 320/108 |

FOREIGN PATENT DOCUMENTS

| WO | 2006099298 A3 | | 11/2007 |
|---|---|---|---|
| WO | WO 2011/011289 | * | 1/2011 |
| WO | WO 2011/011289 A2 | | 1/2011 |

* cited by examiner

SYSTEM, METHOD AND DEVICE FOR PROVIDING A STABLE POWER SOURCE WITHOUT THE USE OF DIRECT CONNECTION TO AN AC OR DC SOURCE

FIELD OF THE INVENTION

The present invention to the field of powering electrical components and devices and more particularly to safely harvesting power from an electrical power line.

BACKGROUND OF THE INVENTION

Within a power system, it is important to monitor line conditions, disturbances, faults etc. . . . Devices are integrated with such electrical power grids to monitor, control meter, communicate and perform a variety of other functions. For example, power line communication repeaters are used in some rural areas to transmit information from an automatic metering infrastructure (AMI). In general, the problem is in keeping electronic circuits, especially communication circuitry, operating while deployed within AC powered utility grid systems. Whatever power is provided to these devices must be able to supply adequate power for circuitry and ancillary communication equipment.

These devices and sensors (and their communications equipment) require power to operate. Low power sensors can rely upon high capacity batteries for years. However, to keep the sensor size and cost to a minimal, it is desired that the energy needs of the sensors and devices be met by miniature inexpensive batteries (for example coin cell batteries). These batteries will require frequent charging. Other powering means have involved solar cells and/or power transformers.

Generally all of these currently available means are less than ideal, are unreliable and are expensive. Batteries have limited power ability and the provision of ongoing power is always an issue. Solar power can assist in power regeneration but external factors such as day length, geography and weather can impact their usefulness. Power transformers are a solution but are prohibitively expensive and are over-kill i.e. they provide more power than is needed for the sensors and devices on the power grid. So, with all of these solutions either not enough or too much power is created.

A more recently explored solution is the use of devices to harvest energy directly from the current carrying conductor in a power system. The issue: it is not possible to input AC power into the devices, and DC power is not available in these environments. Researchers working in the field of energy harvesting are exploiting the principle of electromagnetic (EM) induction. More recently, Bhuiyan et al. investigated the use of an energy coupler by which wireless sensors can harvest power from a current carrying conductor.

Power line harvesting, using all currently available technologies, suffer from at least two major drawbacks: 1) lack of means to manage and control and provide consistent power to devices, given that AC power lines do not deliver a consistent amount of power in any electrical distribution system and 2) means to manage the charging and discharging of energy storage devices, fed the AC harvested power.

It is an object of the present invention to obviate or mitigate all or some the above disadvantages.

SUMMARY OF THE INVENTION

The present invention provides, in one aspect, a combined energy harvesting and measuring device, for use in harvesting energy from a power line conductor and in optimizing load balance and charge as between one or more energy storage or energy drawing devices which comprises a single, multi-function current transformer (CT) comprising an electrical winding disposed thereon, the CT configured to receive an induced current on the electrical winding via magnetic flux energy generated by alternating current on the power line conductor and, at the same time, configured to measure current flow on the power line conductor; and a circuit electrically coupled to the electrical winding and configured to convert the harvested and received induced current into an electrical energy for consumption by an electrical device, wherein the CT is electrically configured within the energy harvesting and measuring device to perform, in its entirety, the dual functions of harvesting power and measuring power through a power line and wherein the combined energy harvesting and measuring device i) powers an electrical device; ii) charges/powers energy storage devices and iii) manages charge within said energy storage device.

The present invention provides, in another aspect, a method for powering an electrical device by way of power harvested from a power line conductor, and measuring said power across a line without permanently modifying the power line, which comprises at least the steps of:
  a) releasably connecting onto the power line conductor a dual-function CT, said CT comprising an electrical winding which receives induced AC from a magnetic field generated by current within said power line;
  b) routing the induced AC to a rectifier circuit coupled to the winding;
  c) converting the induced AC to DC by way of the rectifier;
  d) supplying the DC to one or more energy storage devices to charge said devices;
  e) observing, monitoring and balancing the charging of the said one or more devices; and
  f) switching a single CT, as required, between electrically coupled, multi-functions of power harvesting, as provided in the steps above thereby to charge at least one energy storage device and to perform power measurement, wherein power through the power line conductor is measured.

The present invention provides, in another aspect, a non-transitory processor readable medium storing code representing instructions to cause a processor to operate a combined energy harvesting and measuring device, said device for use in harvesting energy from a power line conductor and in optimizing load balance and charge as between one or more energy storage or energy drawing devices said harvesting, measuring and optimizing comprising the steps of:
  a) releasably connecting onto the power line conductor a dual-function CT, said CT comprising an electrical winding which receives induced AC from a magnetic field generated by current within said power line;
  b) routing the induced AC to a rectifier circuit coupled to the winding;
  c) converting the induced AC to DC by way of the rectifier;
  d) supplying the DC to one or more energy storage devices to charge said devices;
  e) observing, monitoring and balancing the charging of the said one or more devices; and
  f) switching a single CT, as required, between electrically coupled, multi-functions of power harvesting, as provided in the steps above thereby to charge at least one energy storage device and to perform power measurement, wherein power through the power line conductor is measured.

The present invention provides, in another aspect, a system for use in harvesting energy from a power line conductor and in optimizing load balance and charge as between one or more energy storage or energy drawing devices which comprises
a) an energy harvesting and measuring device;
b) at least one energy storage and/or drawing device; and
c) a power line conductor;
wherein the energy harvesting and measuring device comprises a single, multi-function current transformer (CT) comprising an electrical winding disposed thereon, the CT being configured to receive an induced current on the electrical winding via magnetic flux energy generated by alternating current on the power line conductor and, at the same time, configured to measure current flow on the power line conductor; and a circuit electrically coupled to the electrical winding and configured to convert the harvested and received induced current into an electrical energy for consumption by an electrical device, and wherein the CT is electrically configured within the energy harvesting and measuring device to perform, in its entirety, the dual functions of harvesting power and measuring power through the power line and wherein the combined energy harvesting and measuring device i) powers an electrical device; ii) charges/powers the energy storage device and iii) manages charge within said energy storage device.

A method has been developed to scavenge power off the AC power lines to enable devices and their ancillary communications equipment to stay powered and running. A key aspect of the invention is the provision of a means to inductively charge the devices off of the AC power lines, despite the lack of consistency in AC power lines to deliver the same amount of power in the electrical distribution system. The device, method and system of the present invention comprises hardware circuitry to overcome this issue and to address the AC negative effects, on circuitry, of in-rush current, high currents, transients, harmonics, power outages, etc. . . .

The device, method and system of the present invention further addresses the management of charging and discharging of energy storage devices, such as batteries (which include, but are not limited to Li-Ion batteries) using AC harvested power. Without the improvements and accommodations as provided herein, overcharging the batteries and energy storage devices would cause adverse and potentially dangerous conditions which could lead to failure or fire. Furthermore, charging circuitry, as provided herein, comprises a means to handle conditions such as in-rush currents, high current, low current, transients, and harmonics, has the intelligence to detect these conditions, and prevents them from affecting the main circuitry.

The device, method and system of the present invention afford many other advantages. There is provided herein a device, system and method to provide a stable power source for electronics that are used within the utility electrical distribution grid without the use of direct connection to an AC or DC source. The method involves unique circuitry used to switch charging mechanisms between charging various electrical energy storage devices such as batteries and multiple supercapacitor banks. This system also has the capability of dealing with the adverse conditions found in utility electrical distribution grids, and handles these conditions to maintain the operation of the energy delivery devices for the rest of the electronic system utilizing this energy. Lastly, the system can be used to provide a method for measuring the total current and power in an AC power source, and utilize this same measurement device for providing the necessary power scavenging capabilities to be used to provide energy for the power source of the system.

Most importantly, the combined energy harvesting and measuring device provides multiple functions which include the key aspects of power measuring and scavenging. The present invention provides this energy harvesting and measuring device and method of its use to power an electrical device, without affecting the inherent measurement accuracy through the power line. Furthermore, this is achieved, beneficially via one CT, coupled in its functional entirety, for both harvesting and measurement.

A key aspect of the present invention is the provision in the energy harvesting and measuring device and use of a "split-core" CT that is providing the energy harvesting function through capturing of magnetic flux, routing this energy to a set of energy storage devices such as one or more batteries and/or supercapacitors, observing this charging, balancing it, and then switching the same CT back to measurement functions, wherein by the same CT (not a second CT that is electrically coupled) is used to capture power flow measurement through the conductor. This has not been achieved in the art.

DESCRIPTION OF THE FIGURES

The following figures set forth embodiments in which like reference numerals denote like parts. Embodiments are illustrated by way of example and not by way of limitation in all of the accompanying figures.

PREFERRED EMBODIMENTS OF THE INVENTION

Figure 1:
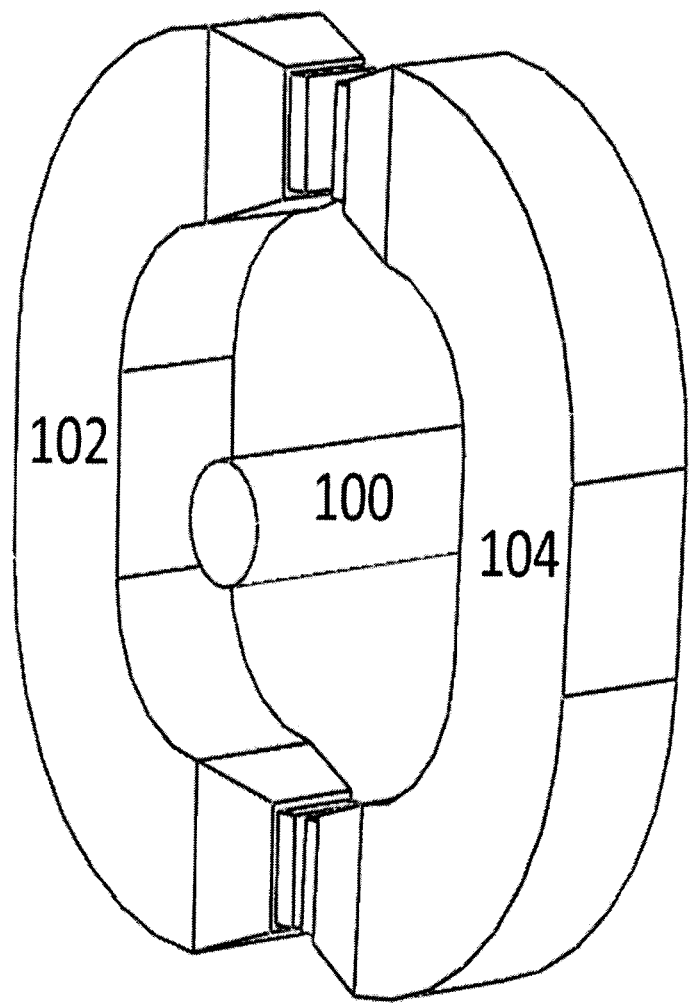
FIG. 1 is a depiction of an Open Core Current Transformer (CT) with Left Side [102] and Right Side [104] around a conducting electrical wire [100].

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "invention" and the like mean "the one or more inventions disclosed in this application", unless expressly specified otherwise.

The terms "an aspect", "an embodiment", "embodiment", "embodiments", "the embodiment", "the embodiments", "one or more embodiments", "some embodiments", "certain embodiments", "one embodiment", "another embodiment" and the like mean "one or more (but not all) embodiments of the disclosed invention(s)", unless expressly specified otherwise.

The term "variation" of an invention means an embodiment of the invention, unless expressly specified otherwise.

A reference to "another embodiment" or "another aspect" in describing an embodiment does not imply that the referenced embodiment is mutually exclusive with another embodiment (e.g., an embodiment described before the referenced embodiment), unless expressly specified otherwise.

The terms "including", "comprising" and variations thereof mean "including but not limited to", unless expressly specified otherwise.

The terms "a", "an" and "the" mean "one or more", unless expressly specified otherwise. The term "plurality" means "two or more", unless expressly specified otherwise.

The term "herein" means "in the present application, including anything which may be incorporated by reference", unless expressly specified otherwise.

The term "whereby" is used herein only to precede a clause or other set of words that express only the intended result, objective or consequence of something that is previously and explicitly recited. Thus, when the term "whereby" is used in a claim, the clause or other words that the term "whereby" modifies do not establish specific further limitations of the claim or otherwise restricts the meaning or scope of the claim.

In this specification the terms "comprise, comprises, comprised and comprising" and the terms "include, includes, included and including" are deemed to be totally interchangeable and should be afforded the widest possible Interpretation.

The term "e.g." and like terms mean "for example", and thus does not limit the term or phrase it explains. For example, in a sentence "the computer sends data (e.g., instructions, a data structure) over the Internet", the term "e.g." explains that "instructions" are an example of "data" that the computer may send over the Internet, and also explains that "a data structure" is an example of "data" that the computer may send over the Internet. However, both "instructions" and "a data structure" are merely examples of "data", and other things besides "instructions" and "a data structure" can be "data".

The term "respective" and like terms mean "taken individually". Thus if two or more things have "respective" characteristics, then each such thing has its own characteristic, and these characteristics can be different from each other but need not be. For example, the phrase "each of two machines has a respective function" means that the first such machine has a function and the second such machine has a function as well. The function of the first machine may or may not be the same as the function of the second machine.

The term "i.e." and like terms mean "that is", and thus limits the term or phrase it explains. For example, in the sentence "the computer sends data (i.e., instructions) over the Internet", the term "i.e." explains that "instructions" are the "data" that the computer sends over the Internet.

Any given numerical range shall include whole and fractions of numbers within the range. For example, the range "1 to 10" shall be interpreted to specifically include whole numbers between 1 and 10 (e.g., 1, 2, 3, 4, . . . 9) and non-whole numbers (e.g. 1.1, 1.2, . . . 1.9).

Where two or more terms or phrases are synonymous (e.g., because of an explicit statement that the terms or phrases are synonymous), instances of one such term/phrase does not mean instances of another such term/phrase must have a different meaning. For example, where a statement renders the meaning of "including" to be synonymous with "including but not limited to", the mere usage of the phrase "including but not limited to" does not mean that the term "including" means something other than "including but not limited to".

Neither the Title (set forth at the beginning of the first page of the present application) nor the Abstract (set forth at the end of the present application) is to be taken as limiting in any way as the scope of the disclosed invention(s). An Abstract has been included in this application merely because an Abstract of not more than 150 words is required under 37 C.F.R. section 1.72(b). The title of the present application and headings of sections provided in the present application are for convenience only, and are not to be taken as limiting the disclosure in any way.

Numerous embodiments are described in the present application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural and logical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

No embodiment of method steps or product elements described in the present application constitutes the invention claimed herein, or is essential to the invention claimed herein, or is coextensive with the invention claimed herein, except where it is either expressly stated to be so in this specification or expressly recited in a claim.

The invention can be implemented in numerous ways, including as a method, a device (or combination of devices), a system, a computer readable medium such as a computer readable storage medium or a computer network wherein program instructions are sent over optical or communication links. In this specification, these implementations, or any other form that the invention may take, may be referred to as systems or techniques. A component such as a processor or a memory described as being configured to perform a task includes both a general component that is temporarily configured to perform the task at a given time or a specific component that is manufactured to perform the task. In general, the order of the steps of disclosed methods or processes may be altered within the scope of the invention.

Within the scope of the present invention, the "power factor" of an AC electric power system is defined as the ratio of the real power flowing to the load to the apparent power in the circuit, and is a dimensionless number between 0 and 1 (frequently expressed as a percentage, e.g. 0.5 pf=50% pf). Real power is the capacity of the circuit for performing work in a particular time. Apparent power is the product of the current and voltage of the circuit. Due to energy stored in the load and returned to the source, or due to a non-linear load that distorts the wave shape of the current drawn from the source, the apparent power will be greater than the real power. In other words, the power factor is the ratio between real power and apparent power in a circuit. It is a practical measure of the efficiency of a power distribution system. For two systems transmitting the same amount of real power, the system with the lower power factor will have higher circulating currents due to energy that returns to the source from energy storage in the load. These higher currents produce higher losses and reduce overall transmission efficiency. A lower power factor circuit will have a higher apparent power and higher losses for the same amount of real power.

Within the scope of the invention, AC is measured by current transformers (CT) which are dual purpose and function, as described further herein. The current to be measured is forced through the primary winding (often a single turn and wherein the single turn/primary winding is the actual conductor) and the current through the secondary winding is found by measuring the voltage across a current-sense resistor (or "burden resistor"). The secondary winding has a burden resistor to set the current scale. The core of some current transformers is split and hinged; it is opened and clipped around the wire to be sensed, then closed, making it unnecessary to free one end of the conductor and thread it through the core. Another clip-on design is the Rogowski coil. It is a magnetically balanced coil that measures current by electronically evaluating the line integral around a current.

In use, current flowing through an overhead line will generate a magnetic field surrounding that line. The CT transforms this magnetic field into a voltage.

With the scope of the present invention, "harmonics" are defined as, "integral multiples of the fundamental frequency. AC power is delivered throughout the distribution system at a fundamental frequency of 60 Hz. (50 Hz in Europe.) As such, the 3rd harmonic frequency is 180 Hz, the 5th is 300 Hz, etc. In the US, the standard distribution system in commercial facilities is 208/120 wye. There are three phase wires and a neutral wire. The voltage between any two phase wires is 208, and the voltage between any single phase wire and the neutral wire is 120. All 120 volt loads are connected between a phase and neutral. When the loads on all three phases are balanced (the same fundamental current is flowing in each phase) the fundamental currents in the neutral cancel and the neutral wire carries no current. When computer loads and other loads using switched mode power supplies are connected, however, the situation changes.

Like the fundamental current, most harmonic currents cancel out on the neutral wire. However, the 3rd harmonic current, instead of canceling, is additive in the neutral. Thus if each phase wire were carrying, in addition to fundamental current, 100 amps of 3rd harmonic current, the neutral wire could be carrying 300 amps of 3rd harmonic current. In many cases, neutral-wire current can exceed phase wire currents. This extra current provides no useful power to the loads. It simply reduces the capacity of the system to power more loads, and produces waste heat in all the wiring and switchgear. When the 3rd harmonic current returns to the transformer it is reflected into the transformer primary where it circulates in the delta winding until it is dissipated as heat. The result is overheated neutral wires, switchgear, and transformers. This can lead to failure of some part of the distribution system and, in the worst case, fires. In addition, waste heat in all parts of the system increases energy losses and results in higher electrical bills. It is estimated that 3rd harmonic currents can increase electrical costs by as much as 8%.

Switch mode power supplies draw current in spikes, which requires the AC supply to provide harmonic currents. The largest harmonic current generated by the SMPS is the 3rd. The magnitude of this harmonic current can be as large as or larger than the fundamental current. Also generated, in smaller amounts, are the 5th, 7th, and all other odd harmonic currents.

With the scope of the present invention, "transients" are defined, whether currents or voltages, as occurrences which are created fleetingly in response to a stimulus or change in the equilibrium of a circuit. Transients frequently occur when power is applied to or removed from a circuit, because of expanding or collapsing magnetic fields in inductors or the charging or discharging of capacitors.

With the scope of the present invention, "phase angle or phase or current ((p", is the angle of difference (in degrees) between voltage and current; Current lagging Voltage (Quadrant I Vector), Current leading voltage (Quadrant IV Vector).

The present disclosure relates to devices, methods and systems of measuring AC current through a power line conductor(s), and harvesting such AC current for use in powering electrical devices, such as sensors on transmission lines.

Current Transformers (CT) are presently used for measuring current in AC lines when direct measurement is not possible because of high voltages, high current or physical constraints. An ideal CT would provide a signal exactly proportional to the desired measurement target. However, no perfectly ideal current transformer exists, and all CT's on the market suffer from some degree of non-linearity, especially near the minimum and maximum current they are designed to measure. For this reason, typical CT solutions available are accurate only within the linear portion of their response curve.

Typically, a CT is accurate from its maximum rated load to a minimum that is 10% of the maximum. For example, a CT suitable for loads up to 100 A is only accurate down to 10 A. This leaves the sensor unable to accurately measure a load below 10 A. Similar situations can arise when using Rogowski Coil measurement sensors, where they are not suitable for signals below certain power levels.

A CT does provide a proportional signal for low current levels below its rated minimum; however it does not relate to the input current the same as for high current levels. Also, as the output signal is very small at this point, it is very susceptible to Electromagnetic Interference (EMI), supply voltage fluctuations and measurement inaccuracies.

One problem addressed by the present invention is in keeping electronic circuits, especially communication circuitry, operating while deployed within AC powered utility grid systems. The system may be used to supply adequate power for circuitry and communication equipment. Such devices cannot directly accept AC power.

A method has herein been developed to scavenge power off the AC power lines to be able to keep devices alive with enough power to allow communications and allow the devices to keep running. These devices are inductively charged off of the AC power lines. As AC power lines do not consistently deliver the same amount of power in the electrical distribution system, the present invention provides hardware circuitry to handle these types of conditions. Furthermore, conditions in AC environments can effect circuitry in negative ways such as in-rush current, high currents, transients, harmonics, power outages, etc.

Another problem relates to the management of the charging and discharging of energy storage devices, such as batteries which include Li-Ion batteries. Overcharging the batteries and energy storage devices causes adverse and potentially dangerous conditions which could lead to failure or fire. Furthermore, at times the charging circuitry had be able to handle conditions such as in-rush currents, high current, low current, transients, and harmonics, and have the intelligence to detect these conditions, and prevent them from affecting the main circuitry. A solution as provided herein has been devised to handle all the problem cases that could occur, while maintaining adequate power levels for the type of circuitry and communication equipment that would need to survive and stay powered within Utility electrical distribution grids for long periods of time.

The solution of the present invention, in a non-limiting way involves:

Scavenging power from the AC line using a split core Current Transformer (CT)

Rectifying AC power produced by CT.

Feeding the induced power from the CT into a charging circuit

Intelligently, based on the level of incoming power, selecting what to charge and charging either:

Set(s) or bank(s) of supercapacitors which can be placed in series, or parallel configuration, or;

A set of batteries, including NiCad, Li-Ion, Li-Polymer, that can also be in Series or Parallel configuration, or;

Releasing this charge and choosing not to charge either energy storage method if both or more energy storage units were full and the device was operating correctly.

Continuing to measure the power being supplied from the inductive charging CT, and determining using a microprocessor whether to charge the supercapacitors, batteries, or to allow the power to be fully dissipated and not be used;

using the energy charged to a large bank of supercapacitors or smaller bank of supercapacitors to be switched between charging the batteries, or to use it to supply power energy to the main circuit board and/or the communication equipment and;

switch the charging to either short out the scavenge power of the CT when either small or large bank of supercapacitors are fully charged, or;

allow the energy through the rectifier to charge the supercapacitor bank, and;

control electronics on the far side of the rectifier to control the switching circuit on the CT side of the rectifier, and;

use the energy within the batteries to be used to supply power energy to the main circuit and/or the communication equipment.

The power scavenge front end preferably uses a bridge rectifier circuit to rectify the coupled current in the transformer. The rectified power is fed to a supercap that stores the power until the gateway controller decides to feed the power to the switcher that routes the power between a larger supercap and/or a battery.

A special circuit has been designed to control the power flow across the bridge diode rectifying circuit that can either short out the scavenge transformer when the local supercap is fully charged (thus keeping dissipated power in the transformer circuit low), or allow the voltage through to the rectifier to charge the local supercap. This circuit allows control electronics on the far side of the rectifier to control the FET's on the transformer-side of the rectifier.

Turning to the figures: FIG. 1 represents an Open Core Current Transformer (CT) with Left Side [102] and Right Side [104] around a conducting electrical wire [100]. The CT as used within the scope of the present invention may be of any shape, including square, round, rectangular, etc. . . .

The CT may also be a solid core design, not having the ability to open its jaws to be placed around the electrical conducting wire [100].

It is most preferred that there not be an air-gap between cores 102 and 104, between the pole faces of the CT. A suitable treatment or coating may be applied to the pole faces to prevent oxidation and degradation over time, and increase reluctance over time without compromising the overall charging capability of the circuit. If an air gap does exist, or more specifically a gap due to the coating or material in between them, compensation can be provided through software.

Figure 2:
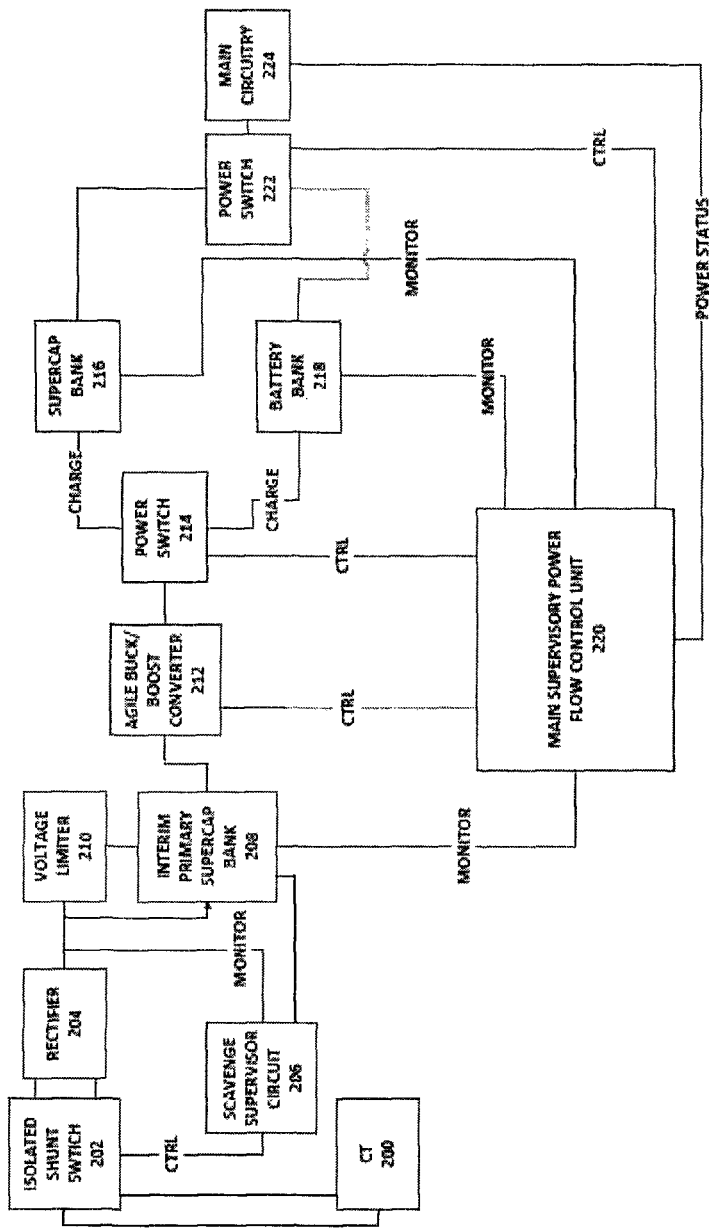
FIG. 2 represents a functional block diagram showing a system and method for the charging and scavenging of power on AC power lines utilizing load balancing techniques.

FIG. 2 represents one system and method for the charging and scavenge of power on AC power lines utilizing load balancing techniques. Inductive charge is supplied by placing a Current Transformer [200] over an AC electrical conducting wire. Then induced differential AC power is fed from the CT [200] to the Isolated Shunt Switch [202] and a Bridge Rectifier [204] where the power is transformed from AC to DC power. The Scavenge Supervisor Circuit [206], which is powered by the Primary Supercap Bank [208], monitors the DC power output from the Rectifier [204] and controls the Isolated Shunt Switch [202]. The Isolated Shunt Switch [202] has the ability to isolate the Rectifier bridge [204] from the differential input power received from the CT [200]. This prevents damage to the entire system in the event of excess power situations caused from inrush currents, harmonics, and transients on the AC electrical wire.

A Voltage Limiter [210] sits in parallel with the Interim Primary Supercap Bank [208] further protect the main circuit, and utilizes high power voltage protection absorption to protect the supercap bank [208] from excess charge. Primary power from the interim supercap bank [208] is then fed to an Agile Buck/Boost voltage converter [212] which is suitable for converting incoming voltages to the correct circuit power voltage levels needed for the next states of the circuit, and the main circuit [224]. Power is then fed into a Power Switch [214] which then either routes power to charge the Supercap Bank [216] or the Battery Bank [218] based on the switch and load balancing decisions made by the Main Supervisory Power Flow Control Unit [220]. The Main Supervisory Power Flow Control Unit [220] monitors the Interim Supercap Bank [208] which makes a decision to control the Agile Buck/Boost voltage converter [212] and by also monitoring Supercap Bank [216] and Battery Bank [218] the Main Supervisory Power Flow Control Unit [220] makes decisions based on load balancing to control the charging of either Supercap Bank [216] or Battery Bank [218] based on charge levels of each. A further Power Switch [222], also controlled by the Main Supervisory Power Flow Control Unit [220], routes power from either the Supercap Bank [216] or Battery Bank [218] to the Main Circuitry [224]. This is important in cases such as supplying a large amount of current needed by the Main Circuitry [224] for items such as communication equipment, or power electronics, etc. that may need sudden rushes of power and this is further decided based on the feedback from the Main Circuitry [224] to the Main Supervisory Power Flow Control Unit [220].

Figure 3:
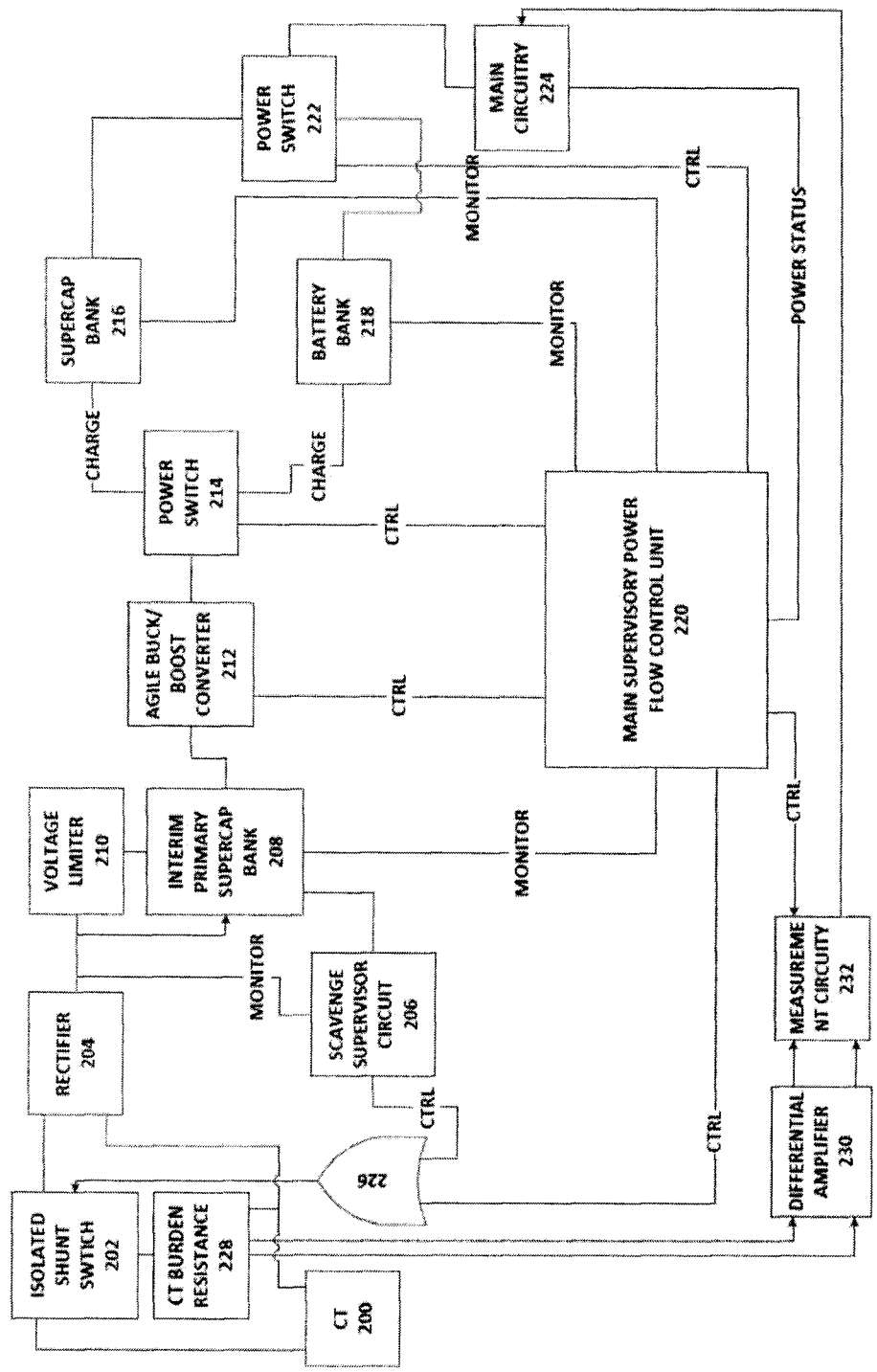
FIG. 3 represents a functional block diagram showing a system and method for the charging and scavenging of power on AC power lines utilizing load balancing techniques.

FIG. 3 represents a preferred system of the present invention and wherein the same CT [200] is used for inductive power scavenging on an AC power line, and also for measurement of Current flow through the AC power line to deduce the total current flow in the AC power line. This will allow the use of a single CT where otherwise two CT's, a smaller CT for measurement purposes and a larger CT for inductive charging purposes, would be needed, with attendant disadvantages. The advantages of utilizing a single CT as opposed to multiple CT's are significant and include less weight and space requirements. One important difference over the system described in FIG. 2: using the same CT [200] for inductive power scavenging on an AC power line, and also using the same CT [200] for measurement of Current flow through the AC power line to deduce the total current flow in the AC power line FIG. 3 shows the differential output signal passed to a Isolated Shunt Switch [202] which is controlled by either the Scavenge Supervisor Circuit [206] or the Main Supervisory Power Flow Control Unit [220]. This control to the Isolated Shunt Switch [202] is through OR-Logic [226] either in software or hardware. The Differential Signal is in parallel with a typical Burden Resistance [228] and the Differential Signal is then passed to a Differential Amplifier [230]. Measurement Circuitry [232], which consists of both analog and digital signal chain operation, converts the differential signal suitable for sending the resulting signal to the Main Circuitry [224] for report, transmission, or storage.

In a preferred form, with respect to the harvesting and measuring device of the present invention, there is provided a means to route energy so harvested to said one or more energy storage devices.

In a preferred form, with respect to the harvesting and measuring device of the present invention, the winding receives alternating current (AC) and the conversion, at step b) is to direct current (DC) for use by the electrical device.

In a preferred form, with respect to the harvesting and measuring device of the present invention, the CT comprises a substantially circular split core transformer comprising a first split core section and a second split core section, the split core transformer configured to provide an opening for disposing the power line conductor between the first and second split core sections, whereby the split core transformer encircles the conductor when installed on the conductor. In one aspect, measuring and harvesting using the single core CT device of the present invention is enabled by the releasable engagement (preferably via a clamping means) of the CT to the power line. In such a way, energy is received in the form of transformation from electromagnetic to voltage from the CT, then this energy is transferred to either "measurement" or "energy" to power the device through the means of switching circuitry. It is to be fully understood that the releasable engagement of the CT on the power conductor allows the power to be measured/scavenged from the local magnetic field around the power conductor. The actual "connection" between the scavenge and measurement circuitry within the single, dual function CT, is comprised of specific components to switch between the two disparate functions.

The CT core may be formed from a variety of different materials, such as grain oriented silicon steel, supermalloy, permalloy, ferrites, and/or other materials. The core is wrapped with wire, typically copper wire (the "electrical winding") with the same electrical windings that surround this core providing the main circuitry with electrical energy and providing the signal measurement. In certain embodiments, the core may be coated with an epoxy which assists in preventing a winding disposed on one of the split core sections from shorting out to the split core section. In a preferred aspect, the cores inside the body of the housing are potted with a liquid material that hardens and also acts as a vibration and damage prevention mechanism from dropping.

In certain exemplary embodiments, some or all of each split cores 102 and 104 may be covered in an insulating material. Such an insulating material can prevent direct contact between the conductive material in each split core section 102, 104 and the conductor 100. The insulating material also can protect the split core sections 102 and 104 from the environment. The surfaces of the split core sections 102 and 104 may optionally be covered with a thin coating to protect them from possible corrosive elements in the environment. In a further preferred form, compensation for this coating is made in software, if the coating is between the faces of the split core.

As noted above, the CT is comprised of two halves: 102 and 104. With the scope of the present invention, BOTH sides are used to charge and BOTH sides are used to measure. The faces come together, the CT "becomes one", and bonds magnetically. This is in complete contrast to prior known devices wherein one side charges, and the other side measures. Furthermore, if in the optional embodiments there is a material between the juncture of the two sides (where the faces come together) such as Kapton tape, the measurements and charging capabilities are effected. The magnetic strength is reduced and essentially the CT is not one unit (it is separated). Within the scope of the present invention, this separation is compensated for in software.

It is preferred that there is only a short distance between adjacent pairs of end surfaces of each core section and split core sections 102 and 104 (and any coating and/or insulation thereon) and they are configured and sized to achieve this.

Optionally, Kapton tape may be placed on the faces of the CT core. This Kapton tape would act as a method of preventing corrosion on the faces of the CT. However, the Kapton tape, or other coating, creates a barrier between the faces of the CT. Compensation for occurs both in the measurement, and also during charging through software within the device.

In a most preferred form, with respect to the harvesting and measuring device of the present invention, the first split core section comprises one of grain oriented steel, supermalloy, permalloy, and ferrites and the second split core section comprises one of grain oriented steel, supermalloy, permalloy, and ferrites.

In a preferred form, with respect to the harvesting and measuring device of the present invention, there is additionally provided a clamping mechanism for releasable attachment to the conductor.

In a preferred form, with respect to the harvesting and measuring method of the present invention, the CT comprises a substantially circular split core transformer comprising a first split core section and a second split core section, the split core transformer being configured to provide an opening for disposing the power line conductor between the first and second split core sections, whereby the split core transformer encircles the conductor when installed on the conductor.

In a preferred form, with respect to the harvesting and measuring method of the present invention, the CT comprises a clamping mechanism having two clamp arms which are spring biased to remain in a closed position and the step of releasably connecting the dual function CT to the power line conductor further comprises securing the power line conductor between the two clamp arms.

In a preferred form, with respect to the harvesting and measuring method of the present invention, the received DC power is fed into a charging circuit.

In a preferred form, with respect to the harvesting and measuring method of the present invention, there is provided a means to select which two or more energy storage devices is to be charged, based on at least the level of incoming harvested power. In one embodiment, there are two storage devices: a battery and a supercap. It is to be understood that there may be others.

Within the present invention, the energy storage devices may be various types of batteries or supercapacitors. Such supercapacitors may be in series or in a parallel configuration. Such batteries may be selected from the group consisting of NiCad, Li-Ion, and Li-Polymer batteries. In a preferred aspect, the circuitry of the present invention may dump/bypass the energy storage devices (two or more) which are completely full. This is a key safety feature.

In certain exemplary embodiments, the split core sections described herein are formed by winding layers of metal around a magnetic form, such as a mandrel, to form a core, and then splitting the core into two sections. The core may be formed from any of a variety of different materials, such as grain oriented silicon steel, supermalloy, permalloy, ferrites, and/or other materials. In certain exemplary embodiments, the core is coated with an epoxy to ensure that a winding disposed on one of the split core sections does not short out to the split core section. The core may be coated either before or after being split into the sections. In certain exemplary embodiments, the core may be vacuum-impregnated with a varnish to hold laminations of the core together and protect the core from moisture. In certain exemplary embodiments, the thickness of the laminations is configured for 60 Hz operation.

Those skilled in the relevant art will appreciate that the power harvesting devices of the invention and electrical drawing devices, such as sensors (with which they be aligned to which they feed power) described herein may be implemented and/or calibrated with a computing system, including networks. In this regard, the following information is instructive of such computing environments.

Such aspects of the invention may be practiced with any computer configurations, including hand-held devices, multiprocessor systems, microprocessor-based or programmable consumer electronics, personal computers ("PCs"), network PCs, mini-computers, mainframe computers, and the like. In one aspect, the measurement data is communicated wirelessly on a peer-to-peer network to a central network manager. In one aspect, the system comprises a plurality of sensors.

Within the scope of the present invention, data acquisition may preferably be controlled by a computer or microprocessor. As such, the invention can be implemented in numerous ways, including as a process, an apparatus, a system, a computer readable medium such as a computer readable storage medium or a computer network wherein program instructions are sent over optical or communication links. In this specification, these implementations, or any other form that the invention may take, may be referred to as systems or techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

The following discussion provides a brief and general description of a suitable computing environment in which various embodiments of the system may be implemented. In particular, this is germane to the network managers, which aggregate measurement data and downstream to the servers which enables viewing of the data by a user at an interface.

Although not required, embodiments will be described in the general context of computer-executable instructions, such as program applications, modules, objects or macros being executed by a computer. Those skilled in the relevant art will appreciate that the invention can be practiced with other computer configurations, including hand-held devices, multiprocessor systems, microprocessor-based or programmable consumer electronics, personal computers ("PCs"), network PCs, mini-computers, mainframe computers, and the like. The embodiments can be practiced in distributed computing environments where tasks or modules are performed by remote processing devices, which are linked through a communications network. In a distributed computing environment, program modules may be located in both local and remote memory storage devices.

A computer system may be used as a server including one or more processing units, system memories, and system buses that couple various system components including system memory to a processing unit. Computers will at times be referred to in the singular herein, but this is not intended to limit the application to a single computing system since in typical embodiments, there will be more than one computing system or other device involved. Other computer systems may be employed, such as conventional and personal computers, where the size or scale of the system allows. The processing unit may be any logic processing unit, such as one or more central processing units ("CPUs"), digital signal processors ("DSPs"), application-specific integrated circuits ("ASICs"), etc. Unless described otherwise, the construction and operation of the various components are of conventional design. As a result, such components need not be described in further detail herein, as they will be understood by those skilled in the relevant art.

A computer system includes a bus, and can employ any known bus structures or architectures, including a memory bus with memory controller, a peripheral bus, and a local bus. The computer system memory may include read-only memory ("ROM") and random access memory ("RAM"). A basic input/output system ("BIOS"), which can form part of the ROM, contains basic routines that help transfer information between elements within the computing system, such as during startup.

The computer system also includes non-volatile memory. The non-volatile memory may take a variety of forms, for example a hard disk drive for reading from and writing to a hard disk, and an optical disk drive and a magnetic disk drive for reading from and writing to removable optical disks and magnetic disks, respectively. The optical disk can be a CD-ROM, while the magnetic disk can be a magnetic floppy disk or diskette. The hard disk drive, optical disk drive and magnetic disk drive communicate with the processing unit via the system bus. The hard disk drive, optical disk drive and magnetic disk drive may include appropriate interfaces or controllers coupled between such drives and the system bus, as is known by those skilled in the relevant art. The drives, and their associated computer-readable media, provide non-volatile storage of computer readable instructions, data structures, program modules and other data for the computing system. Although a computing system may employ hard disks, optical disks and/or magnetic disks, those skilled in the relevant art will appreciate that other types of non-volatile computer-readable media that can store data accessible by a computer system may be employed, such a magnetic cassettes, flash memory cards, digital video disks ("DVD"), Bernoulli cartridges, RAMs, ROMs, smart cards, etc.

Various program modules or application programs and/or data can be stored in the computer memory. For example, the system memory may store an operating system, end user application interfaces, server applications, and one or more application program interfaces ("APIs").

The computer system memory also includes one or more networking applications, for example a Web server application and/or Web client or browser application for permitting the computer to exchange data with sources via the Internet, corporate Intranets, or other networks as described below, as well as with other server applications on server computers such as those further discussed below. The networking application in the preferred embodiment is markup language based, such as hypertext markup language ("HTML"), extensible markup language ("XML") or wireless markup language ("WML"), and operates with markup languages that use syntactically delimited characters added to the data of a document to represent the structure of the document. A number of Web server applications and Web client or browser applications are commercially available, such those available from Mozilla and Microsoft.

The operating system and various applications/modules and/or data can be stored on the hard disk of the hard disk drive, the optical disk of the optical disk drive and/or the magnetic disk of the magnetic disk drive.

A computer system can operate in a networked environment using logical connections to one or more client computers and/or one or more database systems, such as one or more remote computers or networks. A computer may be logically connected to one or more client computers and/or database systems under any known method of permitting computers to communicate, for example through a network such as a local area network ("LAN") and/or a wide area network ("WAN") including, for example, the Internet. Such networking environments are well known including wired and wireless enterprise-wide computer networks, intranets, extranets, and the Internet. Other embodiments include other types of communication networks such as telecommunications networks, cellular networks, paging networks, and other mobile networks. The information sent or received via the communications channel may, or may not be encrypted. When used in a LAN networking environment, a computer is connected to the LAN through an adapter or network interface card (communicatively linked to the system bus). When used in a WAN networking environment, a computer may include an interface and modem or other device, such as a network interface card, for establishing communications over the WAN/Internet.

In a networked environment, program modules, application programs, or data, or portions thereof, can be stored in a computer for provision to the networked computers. In one embodiment, the computer is communicatively linked through a network with TCP/IP middle layer network protocols; however, other similar network protocol layers are used in other embodiments, such as user datagram protocol ("UDP"). Those skilled in the relevant art will readily recognize that these network connections are only some examples of establishing communications links between computers, and other links may be used, including wireless links.

While in most instances a computer will operate automatically, where an end user application interface is provided, a user can enter commands and information into the computer through a user application interface including input devices, such as a keyboard, and a pointing device, such as a mouse. Other input devices can include a microphone, joystick, scanner, etc. These and other input devices are connected to the processing unit through the user application interface, such as a serial port interface that couples to the system bus, although other interfaces, such as a parallel port, a game port, or a wireless interface, or a universal serial bus ("USB") can be used. A monitor or other display device is coupled to the bus via a video interface, such as a video adapter (not shown). The computer can include other output devices, such as speakers, printers, etc.

It is to be fully understood that the present methods, systems and devices also may be implemented as a computer program product that comprises a computer program mechanism embedded in a computer readable storage medium. For instance, the computer program product could contain program modules. These program modules may be stored on CD-ROM, DVD, magnetic disk storage product, flash media or any other computer readable data or program storage product. The software modules in the computer program product may also be distributed electronically, via the Internet or otherwise, by transmission of a data signal (in which the software modules are embedded) such as embodied in a carrier wave.

For instance, the foregoing detailed description has set forth various embodiments of the devices and/or processes via the use of examples. Insofar as such examples contain one or more functions and/or operations, it will be understood by those skilled in the art that each function and/or operation within such examples can be implemented, individually and/or collectively, by a wide range of hardware, software, firmware, or virtually any combination thereof. In one embodiment, the present subject matter may be implemented via ASICs. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that the mechanisms taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, flash drives and computer memory; and transmission type media such as digital and analog communication links using TDM or IP based communication links (e.g., packet links).

While the forms of sensor/CT/device, method and system described herein constitute preferred embodiments of this invention, it is to be understood that the invention is not limited to these precise forms. As will be apparent to those skilled in the art, the various embodiments described above can be combined to provide further embodiments. Aspects of the present systems, methods and sensors (including specific components thereof) can be modified, if necessary, to best employ the systems, methods, nodes and components and concepts of the invention. These aspects are considered fully within the scope of the invention as claimed. For example, the various methods described above may omit some acts, include other acts, and/or execute acts in a different order than set out in the illustrated embodiments.

Further, in the methods taught herein, the various acts may be performed in a different order than that illustrated and described. Additionally, the methods can omit some acts, and/or employ additional acts.

These and other changes can be made to the present systems, methods and articles in light of the above description. In general, in the following claims, the terms used should not be construed to limit the invention to the specific embodiments disclosed in the specification and the claims, but should be construed to include all possible embodiments along with the full scope of equivalents to which such claims are entitled. Accordingly, the invention is not limited by the disclosure, but instead its scope is to be determined entirely by the following claims.

The invention claimed is:

1. A combined energy harvesting and measuring device, for use with a power line conductor, wherein the combined energy harvesting and measuring device comprises:
   a) a single, dual function current transformer (CT) comprising an electrical winding disposed thereon, the CT configured to receive an induced current on the electrical winding via magnetic flux energy generated by alternating current on the power line conductor and at the same time configured to measure current flow on the power line conductor; and
   b) a circuit electrically coupled to the electrical winding and configured to convert the harvested and received induced current into an electrical energy for consumption by an electrical device; wherein the CT is electrically configured within the energy harvesting and measuring device to perform, in its entirety, the dual functions of harvesting power and measuring power through said power line conductor and wherein the combined energy harvesting and measuring device
      i) powers the electrical device;
      ii) powers two or more energy storage/usage devices and
      iii) manages charge within said energy storage/usage devices by invoking dump/bypass circuitry upon at least one energy storage device being completely full, wherein said two or more energy storage/usage devices include the at least one energy storage device.

2. The device of claim 1, wherein said circuit electrically coupled to said electrical winding and configured to convert said harvested and received induced current into said electrical energy for consumption by said electrical device is configured to provide direct current (DC) to the electrical device.

3. The device of claim 1 wherein the CT comprises a substantially circular split core transformer comprising a first split core section and a second split core section, the split core transformer configured to provide an opening for disposing the power line conductor between the first and second split core sections, whereby the split core transformer encircles the conductor when installed on the conductor.

4. The device of claim 2 wherein the first split core section comprises one of grain oriented steel, supermalloy, permalloy, or ferrites and the second split core section comprises one of grain oriented steel, supermalloy, permalloy, or ferrites.

5. The device of claim 1 further comprising a clamping mechanism for releasable attachment to the conductor.

6. A method for powering an electrical device by way of power harvested from a power line conductor without permanently modifying the power line conductor, which method comprises:
   a) releasably connecting onto the power line conductor a dual-function current transformer (CT), said CT comprising an electrical winding which receives induced AC from a magnetic field generated by current within said power line conductor;
   b) routing the induced AC to a rectifier circuit coupled to the winding;
   c) converting the induced AC to DC by way of the rectifier circuit;
   d) supplying the DC to one or more energy storage devices to charge said one or more energy storage devices;
   e) observing, monitoring and balancing the charging of the said one or more devices; and
   f) switching a single CT between its dual functions of power harvesting, as provided in the steps above thereby to charge said one or more energy storage devices, and power measurement, wherein power through the power line conductor is measured without harvesting.

7. The method of claim 6, further comprising configuring a substantially circular split core transformer to include a first split core section and a second split core section and to provide an opening for disposing the power line conductor between the first and second split core sections, whereby the split core transformer encircles the conductor when installed on the conductor.

8. The method of claim 6, further comprising configuring the first split core section with one of grain oriented steel, supermalloy, permalloy, or ferrites and the second split core section with one of grain oriented steel, supermalloy, permalloy, or ferrites.

9. The method of claim 6, wherein the CT comprises a clamping mechanism having two clamp arms which are spring biased to remain in a closed position and wherein releasably connecting the dual function CT onto the power line conductor comprises securing the power line conductor between the two clamp arms.

10. The method of claim 6, further comprising selecting which of the one or more energy storage devices is to be charged, based on at least the level of incoming harvested power, wherein the one or more energy storage devices.

11. The method of claim 6, wherein said supplying the DC includes charging one or more supercapacitors and wherein the one or more energy storage devices include said one or more supercapacitors.

12. The method of claim 6, wherein said supplying the DC includes charging two or more supercapacitors and wherein the one or more energy storage devices include the two or more supercapacitors in a parallel configuration.

13. The method of claim 6, wherein said supplying the DC includes charging two or more supercapacitors and wherein the one or more energy storage devices include the two or more supercapacitors in a series configuration.

14. The method of claim 6, wherein said supplying the DC includes charging a battery and wherein the one or more energy storage devices include said battery.

15. The method of claim 6, wherein said supplying the DC includes charging a battery and wherein the one or more energy storage devices include said battery selected from the group consisting of NiCad, Li-Ion, and Li-Polymer batteries.

16. The method of claim 6 additionally including, at steps d), e) and f) of selectively not charging at least one of the one or more energy storage devices based on the capacity of each device of the one or more energy storage devices.

17. A system for use in harvesting energy from a power line conductor, wherein the system comprises:
   a) an energy harvesting and measuring device;
   b) two or more energy-receiving devices including ancillary communication equipment and an energy storage device; and
   c) the power line conductor;
wherein the energy harvesting and measuring device comprises a single, multi-function current transformer (CT) comprising an electrical winding disposed thereon, the CT being configured to receive an induced current on the electrical winding via magnetic flux energy generated by alternating current on the power line conductor and, at the same time, configured to measure current flow on the power line conductor; and
a circuit electrically coupled to the electrical winding and configured to convert the harvested and received induced current into an electrical energy for consumption by the two or more energy-receiving devices, and wherein the CT is electrically configured within the energy harvesting and measuring device to perform dual functions of harvesting power and measuring power through the power line conductor and wherein the combined energy harvesting and measuring device
   i) powers said ancillary communication equipment;
   ii) charges/powers the energy storage device and
   iii) manages charge within said energy storage device.

18. The system of claim 17, wherein the CT comprises a split core in which coating covers faces of the CT so as to prevent corrosion thereon and wherein software within the circuit compensates for the coating while performing both of the dual functions of harvesting power and measuring power.

19. The system of claim 17, wherein the energy storage device is a battery, wherein the two or more energy-receiving devices further include one or more supercapacitors, and wherein the system further comprises routing circuitry configured to optimize both load balancing and charge between the two or more energy-receiving devices by routing the electrical energy for consumption into a charging circuit.

* * * * *